United States Patent
Zhang et al.

(10) Patent No.: US 10,120,049 B2
(45) Date of Patent: Nov. 6, 2018

(54) SYSTEM AND METHOD OF OBTAINING SPATIALLY-ENCODED NMR PARAMETERS FROM ARBITRARILY-SHAPED COMPARTMENTS AND LINEAR ALGEBRAIC MODELING

(71) Applicant: The Johns Hopkins University, Baltimore, MD (US)

(72) Inventors: Yi Zhang, Baltimore, MD (US); Jinyuan Zhou, Cockeysville, MD (US); Paul A. Bottomley, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 612 days.

(21) Appl. No.: 14/715,367

(22) Filed: May 18, 2015

(65) Prior Publication Data
US 2016/0341808 A1    Nov. 24, 2016

(51) Int. Cl.
*G01V 3/00* (2006.01)
*G01R 33/483* (2006.01)
(Continued)

(52) U.S. Cl.
CPC ......... *G01R 33/483* (2013.01); *G01R 33/485* (2013.01); *G01R 33/50* (2013.01);
(Continued)

(58) Field of Classification Search
CPC ............ G01R 33/483; G01R 33/56366; G01R 33/56341; G01R 33/485; G01R 33/5605; G01R 33/50; G01R 33/5611
(Continued)

(56) References Cited

U.S. PATENT DOCUMENTS 4,746,863 A * 5/1988 Crooks .............. G01R 33/4835
                                                    324/309
5,128,629 A    7/1992 Trinh
               (Continued)

FOREIGN PATENT DOCUMENTS

| JP | 08-191816 A | 7/1996 |
| JP | 2001-095773 A | 4/2001 |
| KR | 10-2008-0027135 A | 3/2008 |

OTHER PUBLICATIONS

Kim et al., Water saturation shift referencing (WASSR) for chemical exchange saturation transfer (CEST) experiments. Magn Reson Med 2009;61(6):1441-1450.
(Continued)

*Primary Examiner* — Farhana Hoque
(74) *Attorney, Agent, or Firm* — Venable, LLP; Henry J. Daley

(57) ABSTRACT

An NMR method and system for acquiring and reconstructing a value of an NMR parameter spatially localized to a compartment of interest including performing a first MM of a portion of a sample with a first MRI pulse sequence using the NMR system and using a set of k-space spatial encoding gradients or coil sensitivity encoding maps to obtain a first magnetic resonance image to identify a compartment of interest; generating a second MRI pulse sequence that encodes the NMR parameter with a subset of the set of k-space spatial encoding gradients or the coil sensitivity encoding maps; applying the second MRI pulse sequence using the NMR system to acquire spatial information relating to the NMR parameter from the compartment of interest; segmenting the first magnetic resonance image into a plurality of compartments that includes the compartment of interest; and reconstructing a value of the NMR parameter in the compartment.

30 Claims, 11 Drawing Sheets

(51) Int. Cl.
- G01R 33/485 (2006.01)
- G01R 33/50 (2006.01)
- G01R 33/56 (2006.01)
- G01R 33/563 (2006.01)
- G01R 33/561 (2006.01)

(52) U.S. Cl.
CPC ... *G01R 33/5605* (2013.01); *G01R 33/56341* (2013.01); *G01R 33/56366* (2013.01); *G01R 33/5611* (2013.01)

(58) Field of Classification Search
USPC .................................... 324/303, 307, 309
See application file for complete search history.

(56) References Cited

U.S. PATENT DOCUMENTS

| | | | |
|---|---|---|---|
| 5,214,372 | A | 5/1993 | Vaisanen et al. |
| 5,903,149 | A | 5/1999 | Gonen et al. |
| 5,982,165 | A | 11/1999 | Bowyer et al. |
| 6,310,646 | B1 | 10/2001 | Shi et al. |
| 6,426,623 | B1 | 7/2002 | Bernstein |
| 6,521,874 | B2 | 2/2003 | Thompson et al. |
| 7,098,646 | B2 | 8/2006 | Rose |
| 7,652,464 | B2 | 1/2010 | Lang et al. |
| 7,822,565 | B2 | 10/2010 | Brouk et al. |
| 2003/0151453 | A1 | 8/2003 | Laletin |
| 2004/0100325 | A1 | 5/2004 | van Amerom |
| 2005/0130595 | A1 | 6/2005 | Shurvinton et al. |
| 2005/0227625 | A1 | 10/2005 | Diener |
| 2007/0242715 | A1 | 10/2007 | Gustavsson et al. |
| 2007/0249928 | A1 | 10/2007 | Blezek et al. |
| 2007/0252597 | A1 | 11/2007 | Posse |
| 2008/0177163 | A1 | 7/2008 | Wang et al. |
| 2008/0280583 | A1 | 11/2008 | Chattopadhyay et al. |
| 2009/0251926 | A1 | 10/2009 | Choi et al. |
| 2011/0066025 | A1 | 3/2011 | Bahn |
| 2011/0148411 | A1 | 6/2011 | Bottomley et al. |
| 2011/0152673 | A1 | 6/2011 | Doerr et al. |
| 2013/0134976 | A1* | 5/2013 | Sugiura ............... G01R 33/543 324/314 |
| 2013/0144140 | A1* | 6/2013 | Frederick ............ A61B 5/0042 600/324 |
| 2014/0015529 | A1* | 1/2014 | Bottomley ........... G01R 33/485 324/309 |
| 2014/0015547 | A1 | 1/2014 | Bottomley et al. |

OTHER PUBLICATIONS

Pruessmann et al., SENSE: sensitivity encoding for fast MRI. Magn Reson Med 1999;42(5):952-962.
Ward et al., A new class of contrast agents for MRI based on proton chemical exchange dependent saturation transfer (CEST). J Magn Reson 2000;143(1):79-87.
Weiss et al., ATP flux through creatine kinase in the normal, stressed, and failing human heart. Proc Natl Acad Sci U S A 2005;102(3):808-813.
Zhou et al., Practical data acquisition method for human brain tumor amide proton transfer (APT) imaging. Magn Reson Med 2008;60(4):842-849.
Akoka et al., "Radiofrequency map of an NMR coil by imaging," Magn Reson Imaging 11, 437-441 (1993).
Baker et al., "Evaluation of specific absorption rate as a dosimeter of MRI-related implant heating," J Magn Reson Imaging 20, 315-320 (2004).
Bottomley et al., "RF magnetic field penetration, phase-shift and power dissipation in biological tissue: implications for NMR Imaging," Physics in Medicine and Biology 23, 630-643 (1978).
Bottomley et al., "Homogeneous tissue model estimates of RF power deposition in human NMR studies—local elevations predicted in surface coil decoupling," Ann. N.Y. Acad. Sci. 649, 144-159 (1992).
Bottomley et al., "Power deposition in whole-body NMR imaging," Med Phys 8, 510-512 (1981).
Bottomley, "Turning up the heat on MRI," Journal of the American College of Radiology 5, 853-855 (2008).
Bottomley et al., "Designing passive MRI-safe implantable conducting leads with electrodes," Med Phys 37, 3828-3843 (2010).
Bottomley et al., "Estimating radiofrequency power deposition in body NMR imaging," Magn Reson Med 2, 336-349 (1985).
Brix, M. Reinl and G. Brinker, "Sampling and evaluation of specific absorption rates during patient examinations performed on 1.5-Tesla MR systems," Magn Reson Imaging 19, 769-779 (2001).
Collins et al. "Calculation of radiofrequency electromagnetic fields and their effects in MRI of human subjects," Magn Reson Med 65, 1470-1482 (2011).
Collins et al. "SAR and Bi field distributions in a heterogeneous human head model within a birdcage coil. Specific energy absorption rate," Magn Reson Med 40, 847-856 (1998).
Collins et al. "Temperature and SAR calculations for a human head within volume and surface coils at 64 and 300 MHz," J Magn Reson Imaging 19, 650-656 (2004).
Edelstein et al. "Electronic method for eliminating prescanning RF transmitter amplitude adjustment", Society of Magnetic Resonance in Medicine Sixth Annual Meeting, p. 372. New York, NY, USA, (1987).
Edelstein et al. "The intrinsic signal-to-noise ratio in NMR imaging," Magn Reson Med 3, 604-618 (1986).
Ehses et al. "MRI thermometry: Fast mapping of RF-induced heating along conductive wires," Magn Reson Med 60, 457-461 (2008).
El-Sharkawy et al. "The performance of interventional loopless MRI antennae at higher magnetic field strengths," Med Phys 35, 1995-2006 (2008).
El-Sharkawy et al. "A Multi-Channel, High Dynamic Range, Real Time RF Power Deposition Monitor", Proc Int Soc Magn Reson Med p. 496. Montreal, Canada, (2011).
El-Sharkawy et al. "Accurate Measurement of RF Power Deposition During 3T MRI", 18th Annual Meeting, Int Soc Magn Reson Med p. 3853. Stockholm, Sweden, (2010).
Guidance for Industry and FDA: "Staff Criteria for Significant Risk Investigations of Magnetic Resonance Diagnostic Devices," United States Food and Drug Administration (FDA), 2003.
Homann et al. "Toward individualized SAR models and in vivo validation," Magn Reson Med 66, 1767-1776 (2011).
Ibrahim et al. "Analysis of B 1 field profiles and SAR values for multi-strut transverse electromagnetic RF coils in high field MRI applications," Physics in Medicine and Biology 46, 2545-2555 (2001).
Ibrahim et al. "Dielectric resonances and B(1) field inhomogeneity in UHFMRI: computational analysis and experimental findings," Magn Reson Imaging 19, 219-226 (2001).
International Search Report and Written Opinion of PCT/2012/030173/.
Kumar et al., "Noise figure limits for circular loop MR coils," Magn Reson Med 61, 1201-1209 (2009).
Liu et al., "Calculations of B-1 distribution, specific energy absorption rate, and intrinsic signal-to-noise ratio for a body-size birdcage coil loaded with different human subjects at 64 and 128 MHz," Appl. Magn. Reson. 29, 5-18 (2005).
Mattei et al., "MRI induced heating of pacemaker leads: effect of temperature probe positioning and pacemaker placement on lead tip heating and local SAR," Conf Proc IEEE Eng Med Biol Soc 1, 1889-1892 (2006).
Muranaka et al., "Dependence of RF heating on SAR and implant position in a 1.5T MR system," Magn Reson Med Sci 6, 199-209 (2007).
Nguyen et al., "Numerical evaluation of heating of the human head due to magnetic resonance imaging," IEEE Trans Biomed Eng 51, 1301-1309 (2004).
Nitz et al., "Specific absorption rate as a poor indicator of magnetic resonance-related implant heating," Invest Radiol 40, 713-776 (2005).

(56) References Cited

OTHER PUBLICATIONS

Oh et al., "Experimental and numerical assessment of MRI-induced temperature change and SAR distributions in phantoms and in vivo," Magn Reson Med 63, 218-223 (2010).
Schar et al., "Simultaneous B(o)- and B(1)+-map acquisition for fast localized shim, frequency, and RF power determination in the heart at 3 T," Magn Reson Med 63, 419-426 (2010).
Shellock, "Comments on MR heating tests of critical implants," J Magn Reson Imaging 26, 1182-1185 (2007).
Simunic, "Calculation of energy absorption in a human body model in a homogeneous pulsed high-frequency field," Bioelectrochem. Bioenerg. 47, 221-230 (1998).
Stralka et al., "A prototype RF dosimeter for independent measurement of the average specific absorption rate (SAR) during MRI," J Magn Reson Imaging 26, 1296-1302 (2007).
Wang et al., "Theoretical and experimental investigation of the relationship among SAR, tissues and radio frequencies in MRI," Physica Medica 21, 61-64 (2005).
Wang et al., "SAR and temperature: simulations and comparison to regulatory limits for MRI," J Magn Reson Imaging 26, 437-441 (2007).
Weber et al., "A ultra high field multi-element transceive volume array for small animal MRI," Conf Proc IEEE Eng Med Biol Soc 2008, 2039-2042 (2008).
Zaremba, "FDA Guidelines for Magnetic Resonance Equipment Safety", The American Association of Physicists in Medicine Annual Meeting, p. 8356. Palais des Congres de Montreal, (2002).
Office Action in U.S. Appl. No. 14/005,804, dated Sep. 22, 2016.
Ehses et al., "MRI Thermometry: Fast Mapping of RF-Inducted Heating Along Conductive Wires," Mag. Res. Med. 60:457-461 (2008).
Office Action in U.S. Appl. No. 14/005,804, dated Feb. 2, 2017.
Notice of Allowance in U.S. Appl. No. 14/005,804, dated Jun. 26, 2017.
An et al., Spectral localization by imaging using multielement receiver coils, Magnetic Resonance in Medicine, (2011).
Bashir et al., Natural linewidth chemical shift imaging (NLqCSI), Magnetic Resonance in Medicine, 56 (2006) 7-18.
Beer et al., Absolute concentrations of high-energy phosphate metabolites in normal, hypertrophied, and failing human myocardium measured noninvasively with 31P-SLOOP magnetic resonance spectroscopy, J Am Coll Cardiol, 40 (2002) 1267-1274.
Bottomley et al., Problems and expediencies in human 31P spectroscopy. The definition of localized volumes, dealing with saturation and the technique-dependence of quantification, NMR in Biomedicine, 2 (1989) 284-289.
Bottomley et al., Strategies and Protocols for Clinical 31P Research in the Heart and Brain, Phil. Trans. R. Soc. Lond. A, 333 (1990) 531-544.
Bottomley, NMR Spectroscopy of the Human Heart, in: R.K. Harris, R.E. Wasylishen (Eds.) Encyclopedia of Magnetic Resonance, John Wiley: Chichester, 2009.
Bottomley, Spatial localization in NMR spectroscopy in vivo, Annal NY Acad Sci, 508 (1987) 333-348.
Brooker et al., Selective Fourier transform localization, Magnetic Resonance in Medicine, 5 (1987) 417-433.
Brown et al., NMR chemical shift imaging in three dimensions, Proc. Natl Acad Sci USA, 79 (1982) 3523-3526.
Conway et al., Mitral regurgitation: Impaired systolic function, eccentric hypertrophy, and increased severity are linked to lower phosphocreatine/ATP ratios in humans, Circulation, 97 (1998) 1716-1723.
Dong et al., Lipid signal extraction by SLIM: Application to 1H MR spectroscopic imaging of human calf muscles, Magnetic Resonance in Medicine, 55 (2006) 1447-1453.
El-Sharkawy et al., Quantitative cardiac 31P spectroscopy at 3 Tesla using adiabatic pulses, Magnetic Resonance in Medicine, 61 (2009) 785-795.
Frahm et al., Localized high-resolution proton NMR spectroscopy using stimulated echoes: Initial applications to human brain in vivo, Magnetic Resonance in Medicine, 9 (1989) 79-93.
Gabr et al., Quantifying in vivo MR spectra with circles, Journal of Magnetic Resonance, 179 (2006) 152-163.
Hu et al., SLIM: spectral localization by imaging, Magnetic Reson Medicine, 8 (1988) 314-322.
International Search Report and Written Opinion of PCT/US2012/030176.
Jacob et al., Improved model-based magnetic resonance spectroscopic imaging, Medical Imaging, IEEE Transactions on, 26 (2007) 1305-1318.
Khalidov et al., BSLIM: Spectral Localization by Imaging With Explicit BO Field Inhomogeneity Compensation, Medical Imaging, IEEE Transactions on, 26 (2007) 990-1000.
Kmiecik et al., Lactate quantitation in a gerbil brain stroke model by GSLIM of multiple-quantum-filtered signals, J Magn Reson Imaging, 9 (1999) 539-543.
Liang et al., Constrained reconstruction methods in MR imaging, Rev Magn Reson Med, 4 (1992) 67-185.
Liang et al., A generalized series approach to MR spectrocopic imaging, IEEE Transactions Medical Imaging, 10 (1991) 132-137.
Loffler et al., Localized spectroscopy from anatomically matched compartments: improved sensitivity and localization for cardiac 31P MRS in humans, Journal of Magnetic Resonance, 134 (1998) 287-299.
Meininger et al., Concentrations of human cardiac phosphorus metabolites determined by SLOOP 31P NMR spectroscopy, Magnetic Resonance in Medicine, 41 (1999) 657-663.
Ordidge et al., Image-selected in vivo spectroscopy (ISIS). A new technique for spatially selective NMR spectroscopy, Journal of Magnetic Resonance (1969), 66 (1986) 283-294.
Panych et al., PSFqchoice: A novel MRI method for shaping pointO spread functions in phase I: encoding dimensions, Magnetic Resonance in Medicine, 54 (2005) 159-168.
Smith et al., Altered Creatine Kinase Adenosine Triphosphate Kinetics in Failing Hypertrophied Human Myocardium, Circulation, 114 (2006) 1151-1158.
von Kienlin et al., Advances in human cardiac 31P-MR spectroscopy: SLOOP and clinical applications, J Magn Reson Imaging, 13 (2001) 521-527.
von Kienlin et al., Spectral localization with optimal pointspread function, Journal of Magnetic Resonance, 94 (1991) 268-287.
Weiss et al., ATP flux through creatine kinase in the normal, stressed, and failing human heart, Proc Natl Acad Sci USA, 102 (2005) 808-813.
Weiss et al., Regional Myocardial Metabolism of High-Energy Phosphates during Isometric Exercise in Patients with Coronary Artery Disease, N Engl J Med, 323 (1990) 1593-1600.
Zhang et al., "Magnetic resonance Spectroscopy with Linear Algebraic Modeling (SLAM) for higher speed and sensitivity," Journal of Magnetic Resonance, 2012, vol. 218, pp. 66-76.
Zhang et al., Dramatic speedup in 1D-, 2D- and 3D-MRS scan times with linear algebraic modeling (SLAM), in: Proceedings of the International Society for Magnetic Resonance in Medicine, in press, 2012.
Basser et al., MR diffusion tensor spectroscopy and imaging. Biophys J 1994;66(1):259.
Biswal et al., Functional connectivity in the motor cortex of resting human brain using echo-planar mri. Magn Reson Med 1995;34(4):537-541.
Borthakur et al., Sodium and T1ρ MRI for molecular and diagnostic imaging of articular cartilage. NMR Biomed 2006;19(7):781-821.
Bottomley et al., A review of normal tissue hydrogen NMR relaxation times and relaxation mechanisms from 1-100 MHz: dependence on tissue type, NMR frequency, temperature, species, excision, and age. Med Phys 1984;11:425.
Bottomley et al., Four-angle saturation transfer (FAST) method for measuring creatine kinase reaction rates in vivo. Magn Reson Med 2002;47(5):850-863.
Chavhan et al., Principles, Techniques, and Applications of T2*-based MR Imaging and Its Special Applications 1. Radiographics 2009;29(5):1433-1449.

(56) References Cited

OTHER PUBLICATIONS

Detre et al., Perfusion imaging. Magn Reson Med 1992;23(1):37-45.

Forsén et al., Study of moderately rapid chemical exchange reactions by means of nuclear magnetic double resonance. The Journal of Chemical Physics 1963;39(11):2892-2901.

Hoge et al., A tour of accelerated parallel MR imaging from a linear systems perspective. Concepts Magn Reson Part A 2005;27(1):17-37.

Loan CFV. The ubiquitous Kronecker product. J Comput Appl Math 2000;123(1):85-100.

Posse et al., MR spectroscopic imaging: principles and recent advances. J Magn Reson Imaging 2013;37(6):1301-1325.

Pruessmann et al., Advances in sensitivity encoding with arbitrary k-space trajectories. Magn Reson Med 2001;46(4):638-651.

Schär et al., Triple repetition time saturation transfer (TRiST) 31P spectroscopy for measuring human creatine kinase reaction kinetics. Magn Reson Med 2010;63(6):1493-1501.

Wolff et al., Magnetization transfer contrast (MTC) and tissue water proton relaxation in vivo. Magn Reson Med 1989;10(1):135-144.

Zhang et al., Highly-accelerated quantitative 2D and 3D localized spectroscopy with linear algebraic modeling (SLAM) and sensitivity encoding. J Magn Reson 2013;237:125-138.

Zhou et al., Three-dimensional amide proton transfer MR imaging of gliomas: Initial experience and comparison with gadolinium enhancement. J Magn Reson Imaging 2013;38(5):1119-1128.

\* cited by examiner

SYSTEM AND METHOD OF OBTAINING SPATIALLY-ENCODED NMR PARAMETERS FROM ARBITRARILY-SHAPED COMPARTMENTS AND LINEAR ALGEBRAIC MODELING

This invention was made with government support under EB007829, CA166171, EB009731, and NS083435 awarded by The Department of Health and Human Services, the National Institutes of Health. The government has certain rights in this invention.

BACKGROUND

1. Field of Invention

The field of the currently claimed embodiments of this invention relates to systems and methods of obtaining spatially localized nuclear magnetic resonance parameters.

2. Discussion of Related Art

There are many parameters that can be measured by nuclear magnetic resonance (NMR) and magnetic resonance imaging (MRI) including nuclear spin density, longitudinal relaxation time ($T_1$) (1), longitudinal relaxation time in the rotating frame ($T_{1\rho}$) (2), transverse relaxation time ($T_2$) (1), the inhomogeneously broadened—$T_2$, $T_2^*$, relaxation time (3), apparent diffusion coefficients (ADC) (4), perfusion measures (5), functional MRI (fMRI) measures (6), spectral parameters (7), chemical reaction rates (8), magnetization transfer ratios (9), and chemical exchange saturation transfer (CEST) indices (10), etc, using hydrogen ($^1H$), carbon ($^{13}C$), fluorine ($^{19}F$), sodium ($^{23}Na$) and phosphorus ($^{31}P$) nuclei to name a few. These measures can derive from endogenous compounds present in biological systems, or from exogenous substances or tracers introduced into the system for the purpose of providing diagnostic, prognostic and/or therapeutic information.

In heterogeneous systems, such as the human body, animals or experimental animal models, these parameters are nonuniformly distributed, and therefore it is desirable to obtain measures that are localized to smaller partitions or regions of the system, such as an organ, a lesion, a pathology, or a region from which NMR or MRI information is being sought, within the organ. The standard way to achieve this is MRI which can provide a nearly continuous distribution of the parameters throughout the sample, limited only by the voxel resolution of the image and/or the time required for the scan. However, often there is inadequate time to provide images of the desired parameter at high image resolution due to insufficient signal-to-noise ratio (SNR), insufficient scan time when other clinical information must be acquired during an exam, for example, in the case of patient studies etc. In addition, image voxels acquired by MRI are rectangular and do not conveniently conform to arbitrarily-shaped compartments that coincide with the morphology of an organ or pathology of interest, such that simply increasing the image voxel size does not provide adequate coverage of the desired volume from which the parametric information is being sought, due to overlap of the rectangular voxel with other tissues, for example.

Consequently, there remains a need for systems and methods that can obtain NMR or MRI parameters such as those noted above for at least compartments of interest much more rapidly than measures obtained with conventional NMR and MRI systems and methods.

SUMMARY

A method of localizing a nuclear magnetic resonance (NMR) parameter to at least one compartment of interest of a sample undergoing an NMR examination, comprising: placing the sample in an NMR system; performing a first magnetic resonance imaging (MRI) of at least a portion of the sample with a first MRI pulse sequence using the NMR system and using at least one of a set of k-space spatial encoding gradients or coil sensitivity encoding maps to obtain a first magnetic resonance image to identify at least one compartment of interest; generating a second MRI pulse sequence that encodes the NMR parameter with a subset of the at least one of the set of k-space spatial encoding gradients or the coil sensitivity encoding maps; applying the second MRI pulse sequence using the NMR system to acquire spatial information relating to the NMR parameter from the at least one compartment of interest; segmenting the first magnetic resonance image into a plurality of compartments that includes the at least one compartment of interest; and reconstructing a value of the NMR parameter in the at least one compartment of interest.

An NMR system for acquiring and reconstructing a value of an NMR parameter spatially localized to at least one compartment of interest, the NMR system employing an applied static magnetic field $B_0$, and NMR excitation and detection systems, and comprising an MRI apparatus configured to accommodate a sample of interest, wherein the MRI apparatus is configured to: perform a first magnetic resonance imaging (MRI) of at least a portion of the sample with a first MRI pulse sequence using the NMR system and using at least one of a set of k-space spatial encoding gradients or coil sensitivity encoding maps to obtain a first magnetic resonance image to identify at least one compartment of interest; generate a second MRI pulse sequence that encodes the NMR parameter with a subset of the at least one of the set of k-space spatial encoding gradients or the coil sensitivity encoding maps; apply the second MRI pulse sequence using the NMR system to acquire spatial information relating to the NMR parameter from the at least one compartment of interest; segment the first magnetic resonance image into a plurality of compartments that includes the at least one compartment of interest; and reconstruct a value of the NMR parameter in the at least one compartment of interest.

These and other features and advantages will be apparent from a reading of the following detailed description and a review of the associated drawings. It is to be understood that both the foregoing general description and the following detailed description are explanatory only and are not restrictive of aspects as claimed.

BRIEF DESCRIPTION OF THE DRAWINGS

Further objectives and advantages will become apparent from a consideration of the description, drawings, and examples.

DETAILED DESCRIPTION

Figure 1:
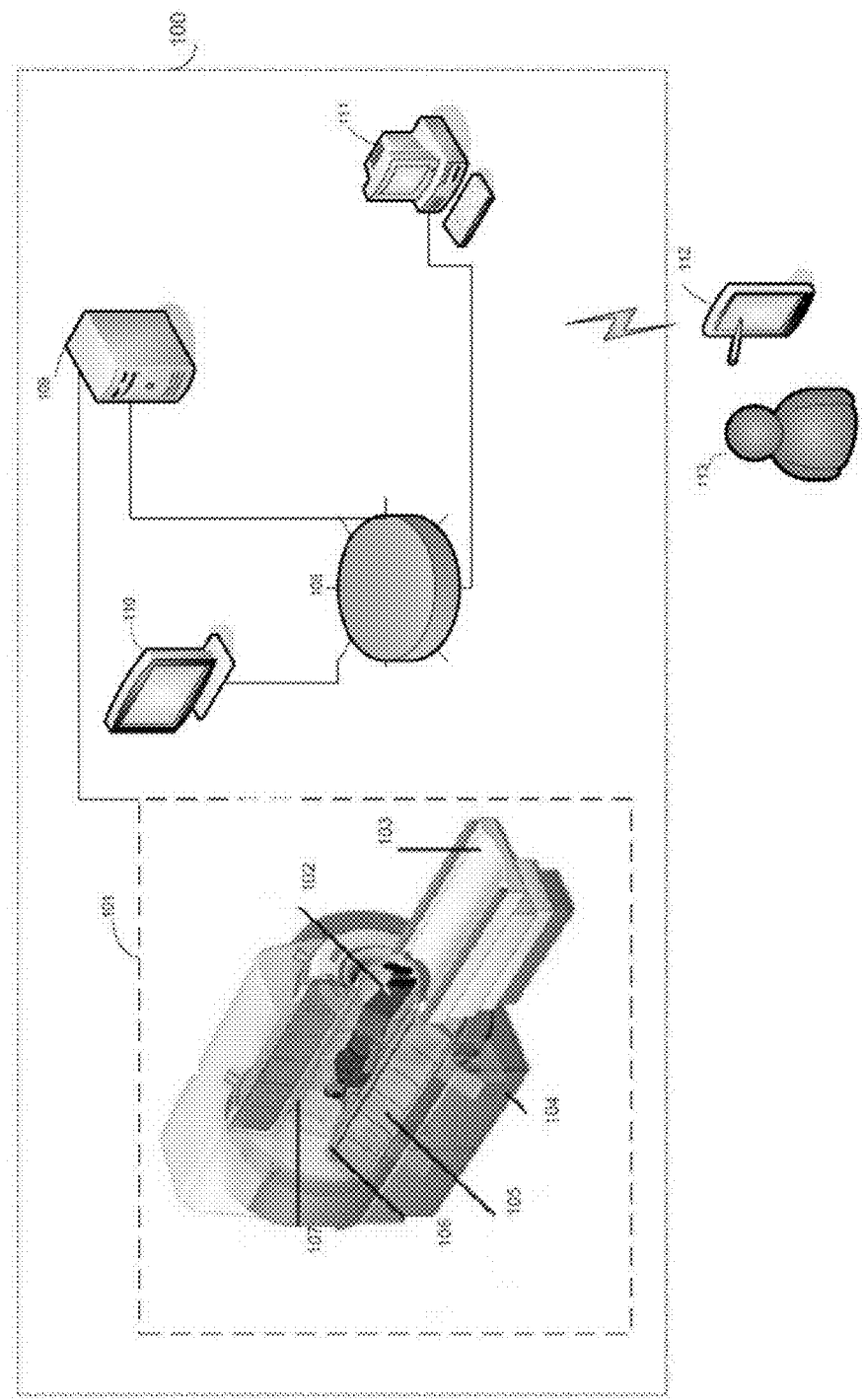
FIG. 1 is a schematic illustration of nuclear magnetic resonance system according to an embodiment of the current invention.

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed and other methods developed without departing from the broad concepts of the current invention. All references cited anywhere in this specification, including the Background and Detailed Description sections, are incorporated by reference as if each had been individually incorporated.

Recently, inventors of the current application described a new method of spatially localizing NMR spectroscopy (MRS) signals to whole user-defined compartments using linear algebraic modeling (SLAM) (11,12). The method provides highly accelerated acquisitions that generate almost the maximum SNR that is achievable from the whole compartment. The central idea of SLAM is to group voxels defined by scout MRI into compartments, and reduce the number of phase-encoding gradient steps to a small subset of the original ones. This subset is comprised of phase-encoding steps typically chosen from the center of image k-space (the "k-space" of a two-dimensional [2D] image is equal to the 2D inverse Fourier transform [FT] of the image). The reduction is possible because the number of unknowns is significantly reduced from the number of voxels, to the number of compartments. The compartmental spectra are solved or reconstructed by incorporating the compartment segmentation information into the standard FT reconstruction model. SLAM has been applied to human cardiac $^{31}P$ MRS (11) and brain $^{1}H$ MRS (12), achieving 4- to 120-fold acceleration factors compared to conventional patient acquisitions, or up to 3-fold higher SNR in heart or tumor compartments compared to summing the constituent MRS voxels post-acquisition, if the scan-time is held constant.

The term "sample" is intended to have a broad meaning. It can be, for example, an inorganic or organic material, a living or non-living organism, and/or a portion of an organism. In some cases, it can be a living human or animal.

The term "compartment" of a sample refers to a subsection of the sample. It could be, without limitation, an organ, or a section of an organ, of a living animal or person, for example. In another example, it could be a tumor or a portion of a tumor in an animal or a person, for example. Further, although a portion of a sample imaged in a voxel is also considered to be a "compartment", the term compartment is not limited to that example. A compartment can be a more general segment of the sample that could take many conventional voxels to represent an image of the compartment. The compartment can be defined in one- two- or three-dimensions (1D, 2D or 3D), for example, and can be of an arbitrary shape as defined by the user (including irregular shaped compartments that are not rectangular circular or spherical but have convex or concave edges, or that contain or surround other compartments, and or include a plurality of regions that have similar properties but which are physically isolated from each other).

Some embodiments of the current invention provide a novel extension of the SLAM method to the localization and measurement of spatial averages from user-defined compartments, for a wide range of NMR parameters so they can be obtained at highly accelerated speeds, essentially permitting up to real time measurements. Embodiments of the current invention can be applied to any or all of the above mentioned parameters, including but not limited to—nuclear spin density, relaxation times ($T_1$, $T_{1\rho}$, $T_2$, $T_2^*$), diffusion coefficients, perfusion measures, functional measures, spectral parameters, chemical reaction rates, and chemical exchange saturation transfer (CEST) indices, using hydrogen ($^{1}H$), carbon ($^{13}C$), fluorine ($^{19}F$), sodium ($^{23}Na$) and phosphorus ($^{31}P$) nuclei. (The U.S. application Pub. Ser. No. 14/006,069, "SYSTEM AND METHOD OF PERFORMING MAGNETIC RESONANCE SPECTROSCOPIC IMAGING" assigned to the same assignee as the current application is hereby incorporated herein by reference.) Some methods and systems according to embodiments of the current invention can be especially useful for providing such measures in animal or patient MRI protocols in which such parametric information would otherwise not be obtainable due to a limited exam time or low sensitivity or SNR or the low concentration of metabolite or compound being interrogated by the NMR/MRI procedure. The fact that results can be provided essentially as fast as real time during an imaging procedure can provide capabilities that would otherwise not be possible. For example, a user could select portions of a scout image to obtain NMR parameter measurements of interest while a person is still present undergoing the imaging procedure. Post-processing analysis often results in the impracticality of obtaining such information since the person would have to return for another imaging session after each post-processing analysis.

Ref (11) described the application of the SLAM technique to MRS spatially in 1D. Ref (12) described the application of the SLAM technique to MRS spatially in 2D and 3D with sensitivity encoding (13). According to an embodiment of the current invention, we shall describe first how to extend SLAM techniques to localize any single one of the aforementioned parameters, in any of one to three spatial dimensions, including in combination with sensitivity encoding, which uses the NMR/MRI coil sensitivity profiles to provide spatial encoding information. We will then present examples of applications in which embodiments of the current invention are used to measure relaxation times, diffusion coefficients, perfusion measures, chemical reaction rates, and the measurement of CEST indices.

FIG. 1 is a schematic illustration of a nuclear magnetic resonance (NMR) system 100 according to an embodiment of the current invention. The NMR system 100 includes a magnetic resonance imaging (MRI) apparatus that is configured to accommodate a sample of interest. The MRI apparatus can include a magnetic resonance scanner 101, a data storage unit 108, and a data processing unit 109. Magnetic resonance scanner 101 has a main magnet 105 providing a substantially uniform main magnetic field $B_0$ for a sample (subject or object) 102 under observation on scanner bed 103, a gradient system 106 providing a perturbation of the main magnetic field $B_0$ to encode spatial information of the constituent molecules of subject 102 under observation, and a radio-frequency (RF) coil system 107 to transmit electromagnetic waves and to receive magnetic resonance signals from subject 102. The receive coil system may employ one or more receive coil elements, wherein use of a plurality or receive elements permits their use for spatial sensitivity ("SENSE") encoding.

Data storage unit 108 may be, for example, a hard disk drive, a network area storage (NAS) device, a redundant array of independent disks (RAID), a flash drive, an optical disk, a magnetic tape, a magneto-optical disk, etc. However, the data storage unit 108 is not limited to these particular examples. It can include other existing or future developed data storage devices without departing from the scope of the current invention.

The data processing system 109 is in communication with magnetic resonance scanner 101 to receive magnetic resonance signals for forming magnetic resonance images of sample 102. Data processing system 109 may be partially or totally incorporated within a structure housing magnetic resonance scanner 101. Data processing system 109 may be partially or totally incorporated in a workstation that is structurally separate from and in communication with magnetic resonance scanner 101. Data processing system 109 may be incorporated in a workstation that is structurally separate from and in communication with magnetic resonance scanner 101. An operator 113 may interact with the NMR system 100 with input/output device 112. (For a fuller description of a typical MRI/NMR system see also, for example, P. A. Bottomley et al, "High-field nuclear magnetic resonance imaging/spectroscopy system" U.S. Pat. No. 4,689,563 Aug. 25 1987)

The NMR system 100 can be further configured to perform a first magnetic resonance imaging (MRI) of at least a portion of the sample with a first MRI pulse sequence using the NMR system 100 and using at least one of a set of k-space spatial encoding gradients or coil sensitivity encoding ("SENSE") maps to obtain a first magnetic resonance image to identify at least one compartment of interest; generate a second MRI pulse sequence that encodes the NMR parameter with a subset of the at least one of the set of k-space spatial encoding gradients or the coil sensitivity encoding maps; apply the second MRI pulse sequence using the NMR system to acquire spatial information relating to the NMR parameter from the at least one compartment of interest; segment the first magnetic resonance image into a plurality of compartments that includes the at least one compartment of interest; and reconstruct a value of the NMR parameter in the at least one compartment of interest.

Methods:

Imaging Localization with SLAM

In accordance with the conventions used in Ref. (12), the image reconstruction problem involves solving the linear equation, $$s_{M'} = E_{M'*M} \times \rho_M, \quad [1]$$

for the image-space data, $\rho$, where s is the vectorized k-space raw data corresponding to the parameter of interest for which the compartment average measure is being sought (eg, $T_1$, $T_{1\rho}$, $T_2$, etc), E is the combined encoding matrix, M' is the total number of known k-space data and M is the number of unknown image space voxels. M' is the product of the number of phase-encoding steps, the number of frequency-encoding steps and the number of coil elements used for sensitivity encoding (Nc).

For multi-receive acquisition (Nc>1), E can be constructed as, $$E = \begin{bmatrix} (PE \otimes FE)_{M'''*M} \times SE^1_{M*M} \\ (PE \otimes FE)_{M'''*M} \times SE^2_{M*M} \\ \vdots \\ (PE \otimes FE)_{M'''*M} \times SE^{Nc}_{M*M} \end{bmatrix}, \quad [2]$$

where PE is the phase-encoding operator, FE is the frequency-encoding operator which now corresponds to the read-out gradient, SE is the sensitivity encoding matrix for each coil element (1, ..., Nc), $\otimes$ is the Kronecker operator (14), and M" (=M'/Nc) is the product of the number of phase-encoding steps (M''') and the number of frequency-encoded points (M"/M'''). When frequency-encoding or sensitivity-encoding is not used, for example, in one dimensional MRS, the FE and SE are simply 1.

Typically for MRI however, because the frequency-encoding dimension is fully-sampled and 2D FT is separable in both phase- and frequency-encoding dimensions, a first FT is applied in the frequency-encoding (read-out) dimension before constructing Eqs. [1-2]. FE in Eq. [2] is then replaced by an identity matrix, and s is replaced by a hybrid k-space vector of the FT of the raw data in the frequency-encoding dimension. Furthermore, a noise covariance matrix can be included in both the s hybrid matrix and the E operator using a pre-whitening strategy (15). For simplicity, the same notations are used after these preprocessing steps. Thus, for a single-channel receive acquisition (Nc=1), E is simply $(PE \otimes FE)_{M'''M}$, where FE is an identity matrix and s is the FT of k-space raw data in the frequency-encoding dimension.

The SLAM method incorporates compartment segmentation and correction information (12) into Eq. [1] as:

$$s_{M'} = E_{M'''*M} \times A_{M'*M}^{-1} \times b_{M'*M}^{-1} \times b_{M'*M} \times A_{M'*M} \times \rho_{M'} \qquad [3]$$

Here the auxiliary b matrix contains the spatial localization information relating to the segmented compartments (11,12), and A is a correction matrix accounting for spatial and temporal main magnetic field ($B_0$) and RF excitation/detection field ($B_1$) inhomogeneity. Dimensionality reduction is performed whereby only the compartmental average values of the signal are retained, leading to, $$s_{M'} = E_{M'''*M} \times A_{M'*M}^{-1} \times b_{M'*C}^r \times \rho_C^r, \qquad [4]$$

where $b^r$ preserves the C columns in $b^{-1}$ corresponding to the C compartmental average values in $\rho^r$. Two possible solutions to Eq. [4] follow:

$$\rho_C^r = (E_{M'''*M} \times A_{M'*M}^{-1} \times b_{M'*C}^r)^+ \times s_{M'} \qquad [5]$$

and $\rho_C^r = (b_{M'*C}^r)^+ \times A_{M'*M} \times (E_{M'''*M})^+ \times s_{M'}$, [6]

where "+" denotes the Moore-Penrose pseudo-inverse. A truncated singular value decomposition (TSVD) (16) strategy is used for computing the pseudo-inverses by discarding singular values that are less than 2% of the maximum ones. The second solution, Eq. [6], was shown to be more compatible with receiver coil sensitivity encoding (SENSE), than Eq. [5] (12), and thus is chosen when SENSE is used. M' for SLAM can be much smaller than that used for conventional SENSE MRI (13) involving FT followed by SENSE unfolding, because only the C unknown compartmental values are solved.

Figure 2A:
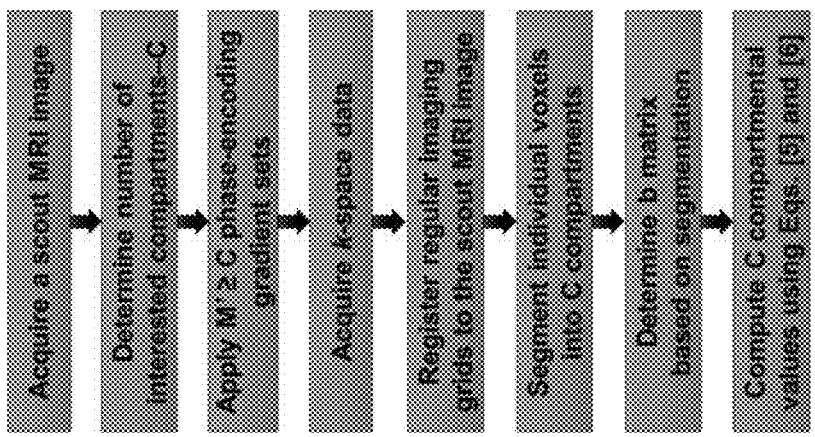
FIG. 2A is a flow chart to explain an embodiment for implementing SLAM.
Figure 2B:
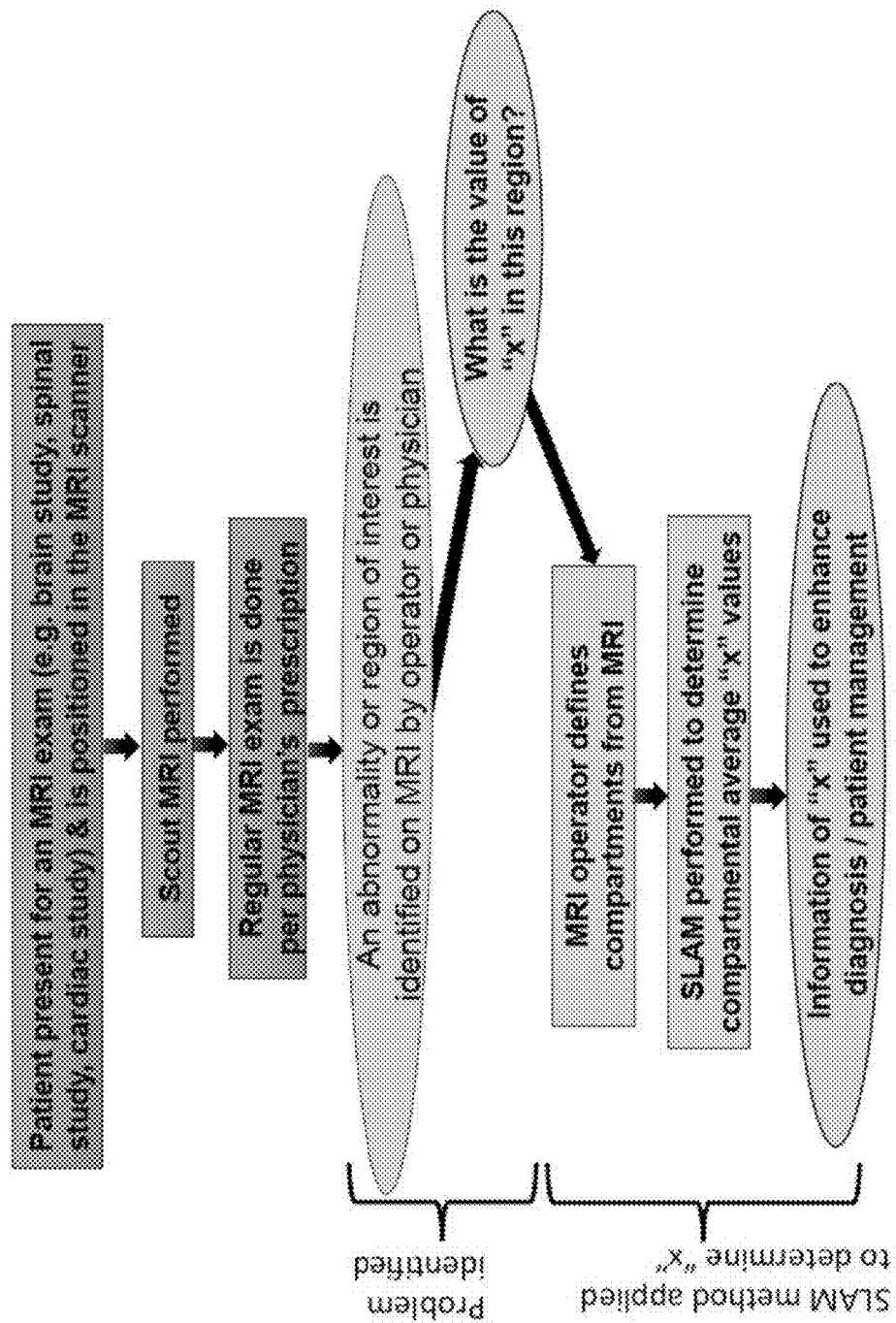
FIG. 2B is a flow chart to explain an embodiment of a protocol for using the SLAM method to measure a compartmental average MRI parameter "x".

The steps of implementing SLAM are shown in FIG. 2A. Each application begins with the acquisition of a simple "scout MRI", which is subsequently used to segment out the compartments from which the desired compartment-average measurements are to be obtained. Note that the term "scout image" or "scout MRI" means any MRI acquired during the scan that is used for the purpose of segmenting out compartments, and need not be an image acquired specifically for this purpose. For example, it could be an image acquired for other diagnostic purposes, just as long as it provides sufficient anatomic detail to permit segmentation. After the scout image is obtained, a regular MRI sequence that incorporates encoding for the parameter of interest is applied ($T_1$, $T_2$, etc), with the critical change that the number of spatial encoding steps for the MRI sequence are drastically reduced, in accordance with the SLAM method, and the parametric information reconstructed as described above, and exemplified below.

Application of SLAM to Measure Relaxation Times

Contrast information predominantly attributed to the distinct relaxation times ($T_1$, $T_{1\rho}$, $T_2$, and $T_2^*$) of different tissues or compartments upon which the widespread use of MRI in the clinic and in research stands. However, the durations required for quantitative relaxation time mapping are long, resulting in the compromise use of qualitative relaxation time weighted-MRI in many clinical studies, which limits inter- and intra-institutional reproducibility and comparisons. This sacrifices the potentially useful diagnostic or prognostic information provided by quantitative relaxation times: specific relaxation times are often not even measured, with "$T_1$-weighted" (T1w), "$T_2$-weighted" (T2W), "diffusion-weighted" (Dw) and the like, images routinely used in their stead. However, SLAM can be extended from the original spectroscopy application, to fundamentally alter this scan time problem by greatly speeding up the scan-time required for compartment average NMR relaxation time measurements in accordance with the current invention.

Figures 3A, 3B:
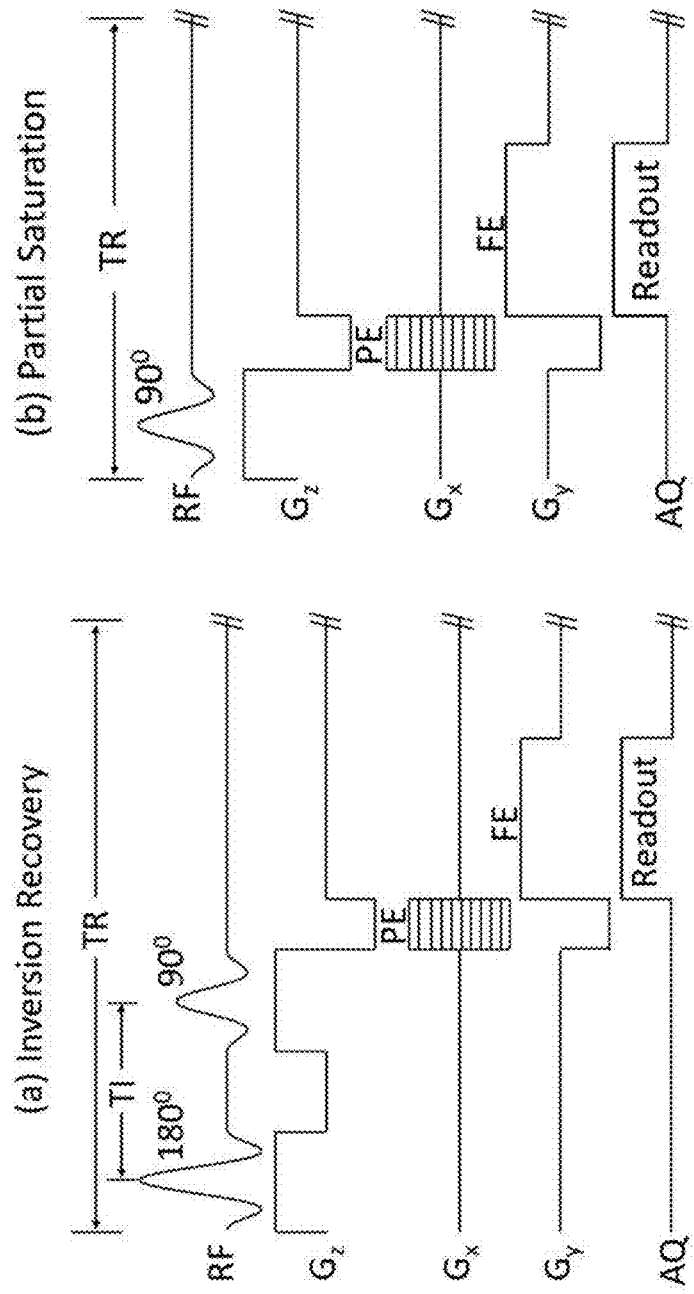
FIGS. 3A-3E show five pulse sequences in accordance with embodiments of the present invention [a: inversion recovery; b: partial saturation; c: spin echo; d: multi-echo Carr-Purcell (CP) or CP-Meiboom-Gill (CPMG); e: gradient refocused echo] for measuring relaxation times. RF refers to the radiofrequency excitation pulse, PE stands for phase encoding, FE stands for frequency encoding, TE refers to echo time, TI is inversion delay time, TR is repetition time, AQ stands for acquisition, and Gx, Gy and Gz refer to the linear gradient fields in x, y, and z directions, respectively.

Specifically, in a first embodiment of the SLAM method designed to obtain quantitative compartment-average $T_1$ measurements: after scout MRI is performed, an inversion recovery MRI sequence (FIG. 3A) comprised of an inversion MRI pulse with a flip angle (FA) sufficient to invert the nuclear magnetization (e.g., FA~180°) followed by an MRI excitation pulse (FA≤90°) is applied at an inversion delay time (TI) later with a reduced number of phase encoding steps, M''', chosen from central k-space in accordance with the SLAM method as described above. The inversion recovery sequence is used to generate a set of $T_1$ "parameter-sensitive" MRI data, by repeatedly applying the sequence with different values of TI (e.g., 6 values) that span a range of time of approximately 1 to 3 times the $T_1$ values present in the sample/subject being investigated, as is known by those skilled in the art; and repeated with the different spatial phase encoding steps to complete the reduced subset of M''' phase encoding steps. Then, for each TI, an average value of the $T_1$-weighted signal from each compartment, $\rho^r$, is reconstructed with Eq. [5] or [6]. With multiple TI and $\rho^r$ values available, compartmental-average $T_1$ values are solved by fitting a 3-parameter exponential function, $\rho^r = u - v \cdot \exp(-TI/T_1)$ to the set of $\rho^r$ data acquired at the different TI values, where u, v, and $T_1$ are unknown constants to be determined.

In a second embodiment of the SLAM method designed to obtain quantitative compartment-average $T_1$ measurements: after scout MRI, a partial saturation MRI sequence (FIG. 3B) comprised of a series of equally spaced MRI excitation pulses with the same FA (typically, FA≤90°) separated in time by the same repetition period, TR, is applied with a reduced number of phase encoding steps M''' chosen from central k-space in accordance with the SLAM method as described above. The sequence is repeated with different values of TR (e.g., 6 values) that span a range of time of approximately 1 to 3 times the $T_1$ values present in the sample/subject being investigated, as is known by those skilled in the art to generate a set of $T_1$-sensitive MRI data; and repeated with the different phase encoding steps to complete the reduced subset of M''' steps. Then, for each TR value, an average value of the $T_1$-weighted signal from each compartment, $\rho^r$, is reconstructed using Eq. [5] or [6]. With multiple TR and $\rho^r$ values available, compartmental-average $T_1$ values are the solved by fitting a 3-parameter exponential function, $\rho^r = u - v \cdot \exp(-TR/T_1)$ to the set of $\rho^r$ data acquired at the different TR values, where u, v, and $T_1$ are (generally different) unknown constants to be determined.

Figures 3C, 3E:
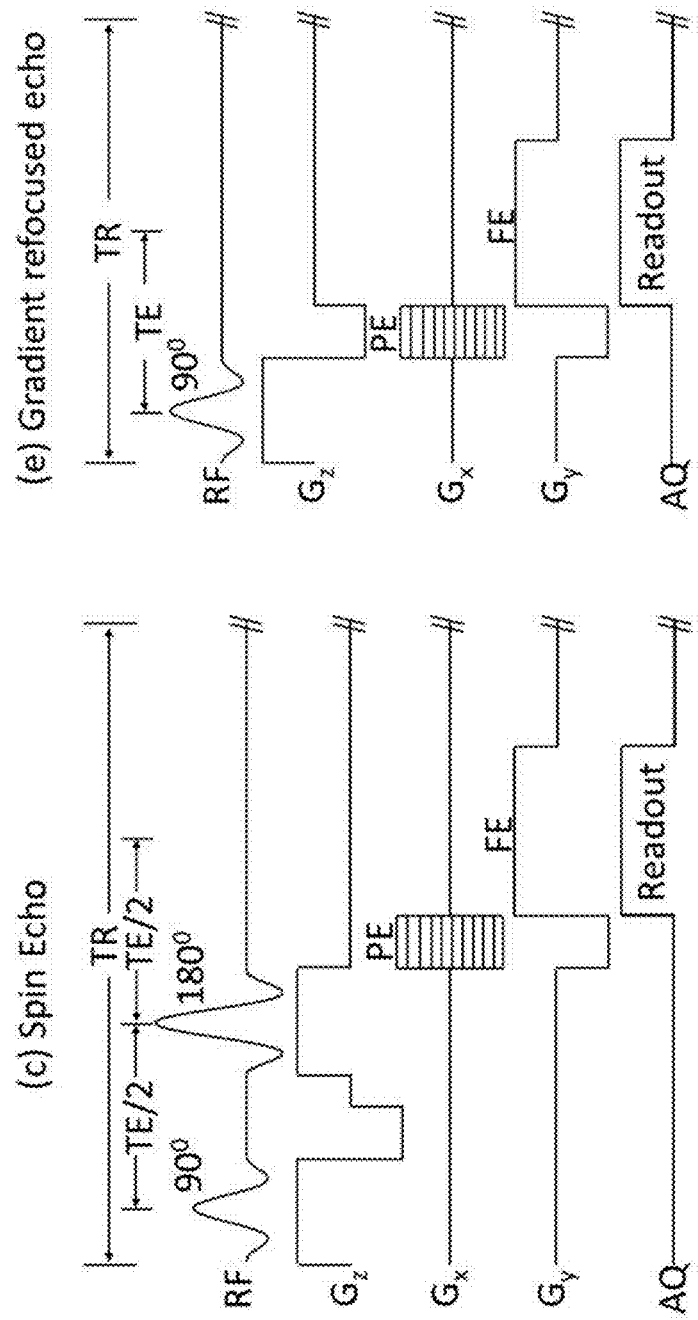

In a third embodiment of the SLAM method designed to obtain quantitative compartment-average $T_2$ measurements, after scout MRI, a single echo time (TE) MRI sequence (FIG. 3C) is used with SLAM. The sequence is comprised of an MRI excitation pulse (typical FA≤90°) followed by an echo-producing pulse with FA substantially equal to 180° at time TE/2. The sequence is repeated for a range of different TE values (e.g. ~6) that span a range of time of approximately 1 to 3 times the $T_2$ values present in the sample/subject being investigated to generate a set of $T_2$ parameter-sensitive MRI data, as is known by those skilled in the art; and repeated as well with the different phase encoding steps to complete the full complement of the SLAM M''' phase encoding steps. For each $T_2$ weighted signal recorded at each TE value, a compartmental-average MRI signal value, $\rho^r$, is reconstructed using Eq. [5] or [6]. Then, the known TE and $\rho^r$ values are fitted to a 2-parameter exponential function, $\rho^r = w \cdot \exp(-TE/T_2)$ where w is an unknown constant, and solved to obtain the $T_2$ of each compartment.

Figure 3D:
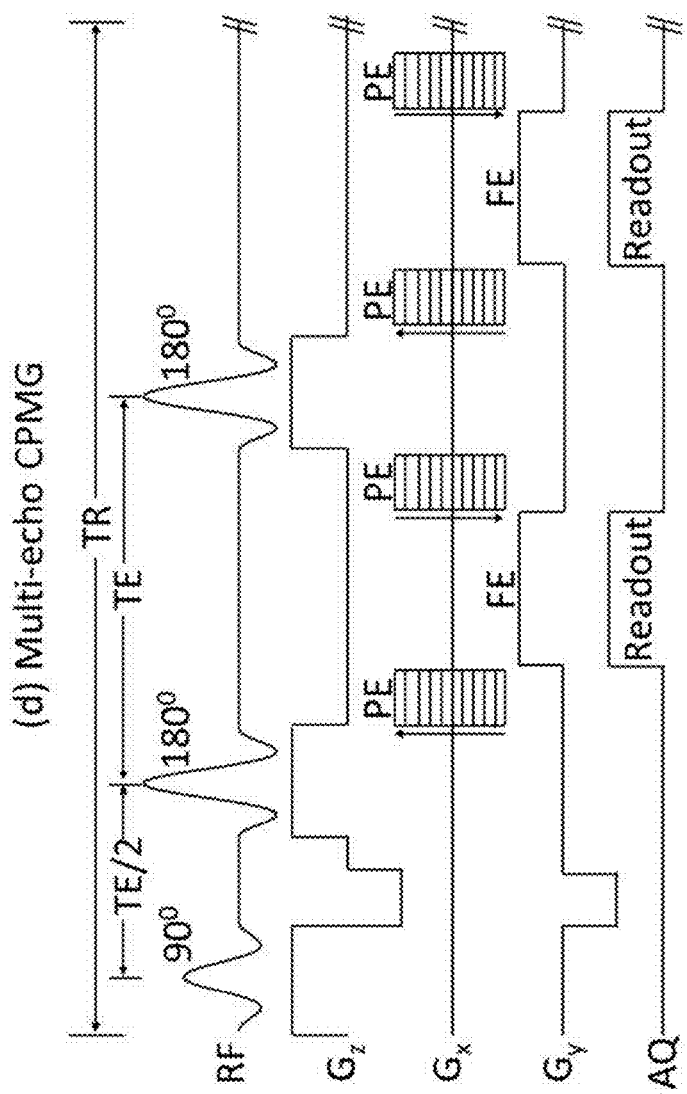

In a fourth embodiment of the SLAM method designed to obtain quantitative compartment-average $T_2$ measurements, after scout MRI, a multiple echo time (TE) MRI sequence (FIG. 3D) is used with SLAM. The sequence is comprised of an MRI excitation pulse (typical FA≤90°) followed by series of $n_e$ echo-producing pulses with FA substantially equal to 180°, repeated at intervals of TE, starting at time TE/2 after the excitation pulse, such that the full range of $n_e$ echoes span a range of time of approximately 1 to 3 times the $T_2$ values present in the sample/subject being investigated, as is known by those skilled in the art, and the set of echo data acquired following the $n_e$ pulses comprises a set of $T_2$ parameter-sensitive MRI data. The entire sequence is repeated with the different phase encoding steps so as to complete acquisition of the full complement of the SLAM M''' spatial encoding steps. For each $T_2$-weighted signal recorded at each TE value, a compartmental-average MRI signal value, $\rho^r$, is reconstructed using Eq. [5] or [6]. Then, the known TE and $\rho^r$ values are fitted to a 2-parameter exponential function, $\rho^r = w \cdot \exp(-TE/T_2)$ where w is an unknown constant, and solved to obtain the $T_2$ of each compartment.

In a fifth embodiment of the SLAM method designed to obtain quantitative compartment-average $T_2^*$ measurements: after scout MRI, a gradient refocused echo MRI sequence (FIG. 3E) comprised of a series of equally spaced MRI excitation pulses is applied with the same FA (typically, FA≤90°) to generate a gradient refocused echo at time TE later. The sequence is repeated with different values of TE that approximately span the range of $T_2^*$ values in the sample as is known by those skilled in the art, and with the reduced number of phase encoding steps M''' chosen from central k-space in accordance with the SLAM method as described above. Then, for each TE value, an average value of the $T_2^*$-weighted signal from each compartment, $\rho^r$, is reconstructed using Eq. [5] or [6]. With multiple TR and $\rho^r$ values available, compartmental-average $T_2^*$ values are solved by fitting a 2-parameter exponential function, $\rho^r = w \cdot \exp(-TE/T_2^*)$ to the set of $\rho^r$ data acquired at the different TE values where w and $T_2^*$ are unknown constants to be determined.

$T_{1\rho}$ can be solved similarly in further embodiments of this invention wherein the $T_1$ and $T_2$ sensitive MRI sequences are replaced by a $T_{1\rho}$ MRI sequence with a reduced number of spatial encoding steps whereupon the SLAM reconstruction method is used to provide a dramatic reduction in scan time for the compartment average measurement, as compared to a fully resolved image.

Application of SLAM to Measure Diffusion and Perfusion Indices

In a sixth embodiment of the SLAM method designed to obtain quantitative compartment-average ADCs, after scout MRI, a diffusion-weighted MRI sequence is used with SLAM. The sequence is comprised of an MRI excitation pulse (typical FA≤90°) followed by an echo-producing pulse with FA substantially equal to 180° and with a pair of diffusion-weighting gradient pulses with one gradient pulse inserted before and one inserted after the 180° pulse. During the gradient pulse, the gradient strength can be static (in accordance with the pulse gradient spin echo, [PGSE] method) or oscillate (in accordance with the oscillating gradient spin echo, [OGSE] method) as is known to those skilled in the art. The sequence is repeated for a range of different diffusion weighting values (b, in s/mm²) that match the range of the ADC value (in mm²/s) present in the sample/subject being investigated, as is known by those skilled in the art; and repeated as well, with the different phase encoding steps to complete the full complement of the SLAM M''' phase encoding steps, and to generate thereby, a set of diffusion parameter-sensitive MRI data. For each diffusion weighted signal recorded at each b value, a compartmental-average MRI signal value, $\rho^r$, is reconstructed using Eq. [5] or [6]. Then, the known b and $\rho^r$ values are fitted to a 2-parameter exponential function, $\rho^r = w \cdot \exp(-b \cdot ADC)$ where w is an unknown constant, and solved to obtain the ADC of each compartment.

In a seventh embodiment of the SLAM method designed to obtain quantitative compartment-average perfusion measures, after scout MRI, an arterial spin labeling MRI sequence is used with SLAM. In prior art, arterial spin labeling (ASL) MRI is used to measure tissue perfusion by deploying an MRI protocol wherein a first MRI is acquired with a spatially selective pulse turned on (the "labeling" pulse) and applied on the inflowing blood side of the tissue of interest. Then a second MRI is acquired either with the labeling pulse turned off or applied equidistant from the tissue of interest as the labeling pulse, but on the outflowing blood side (the "control"). The labeling pulse is applied at a location from the tissue of interest commensurate with the range of influx rates of the arterial blood that infuses it. Subtraction of the label image from the control image provides a tissue perfusion measure. For the new embodiment wherein SLAM is used to obtain quantitative compartment-average perfusion measurements, the ASL sequence is implemented with spatial selective labeling and control pulses, but with the reduced number of spatial encoding steps in accordance with the SLAM method described above. Specifically, the ASL sequence with labeling and control pulses comprise a set of perfusion parameter-sensitive MRI data: each are repeated with the M''' phase encoding steps to complete the full complement of the SLAM encoding set. For each of the label and control acquisitions, a compartmental-average MRI signal value, $\rho^r$, is reconstructed using Eq. [5] or [6]. Then, the subtraction of the two $\rho^r$ values gives compartmental-average perfusion measurement.

Application of SLAM to Measure Creatine Kinase Reaction Rates

Adenosine triphosphate (ATP) is the most important energy source in the human body, which can be generated along with free creatine (Cr) through the following creatine kinase (CK) reaction from phosphocreatine (PCr) and adenosine diphosphate (ADP).

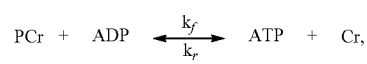

$$PCr + ADP \xrightleftharpoons[k_r]{k_f} ATP + Cr,$$

where $k_f$ and $k_r$ are the pseudo-first-order forward and reverse reaction rates, and specifically $k_f$ refers to the percentage of PCr that is converted to ATP per second. The forward CK ATP flux in heart failure patients was found to be reduced significantly compared to that in normal subjects (17). Central to measuring CK ATP flux, the forward reaction rate, $k_f$, is currently most rapidly measured by the "FAST" (18) or "TRiST" (19) methods which measure PCr from $^{31}$P MRS spectra repetitively using different TR values during which time the ATP peak is saturated with chemical selective NMR excitation or saturation signal, and with a control chemically-selective NMR excitation signal spectrally directed at the opposite side of PCr compared to ATP. However, even these methods require ~40 min for cardiac applications, which may be intolerable for some patients, or which limit acquisition of other useful cardiac MRI information, and which make such measurements susceptible to motion artifacts. The scan time can be significantly reduced if the MRS spectra used in TRiST or FAST are directly measured by SLAM.

Figures 4A, 4B:
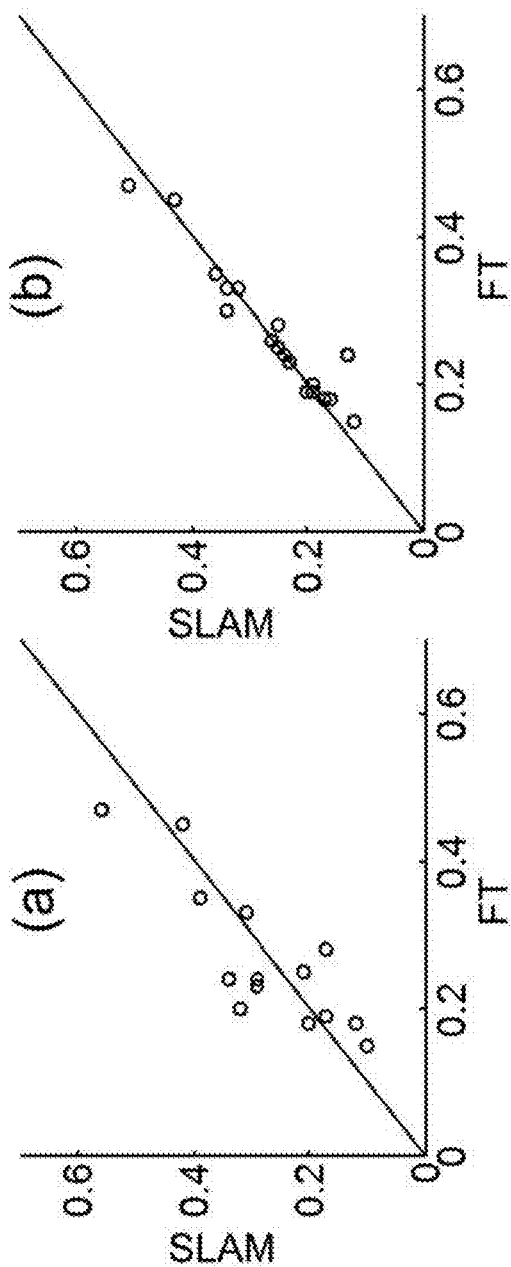
FIGS. 4A-4B show pseudo-first-order forward rates, $k_f$, measured from 16-step FT, compared with results from four-step "SLAM" method combined with the "TRiST" method (19); (a) and eight-step TRiST SLAM (b), in accordance with embodiments of the present invention. Coefficients of determination ($r^2$) are 0.71 (a) and 0.90 (b). The solid line is the identity line.

In an eighth embodiment, Eq. [5] with FE and SE set to 1 is used to reconstruct MRS spectra directly with SLAM using the reduced k-space data sets based on TRiST or FAST encoding (which form a set of reaction rate-sensitive NMR data), which are thereby accelerated by a factor proportional to the reduction in k-space encodings. For example, results of SLAM compared with the standard FT method are shown in FIGS. 4A-4B, acquired with two different acceleration factors, R=2, 4 corresponding to 2- and 4-fold reductions in the number of k-space encodings, to achieve 2- and 4-fold reductions in scan-time. The data in FIGS. 4A-4B illustrates measures of the cardiac-compartment average forward CK reaction rate, $k_f$, obtained from 10 normal volunteers and 9 heart patients.

Adaptation of SLAM to CEST

In CEST MRI, images are typically acquired repetitively using a gradient refocused echo or spin-echo sequence (e.g., in FIGS. 3C-3E), except that the sequence is preceded with a frequency (or chemically-) selective saturation NMR pulse, The frequency of the saturation is advanced in repeat applications of the sequence to generate a set of CEST parameter-sensitive MRI data from which images are obtained. The variation of the signal in each pixel as a function of saturation frequency is known as the "z-spectrum": asymmetry in the z-spectra about the water resonance has been shown to have potential diagnostic value (10).

In the CEST experiment, correcting the nominal saturation frequency offset for the main magnetic field ($B_0$) inhomogeneity is crucial for generating meaningful CEST maps or z-spectra in the saturation frequency offset domain (20,21). In conventional CEST MRI, z-spectra in image space are first linearly interpolated to a finer resolution along the saturation frequency offset dimension and then shifted based on a separately acquired $B_0$ map on a voxel-by-voxel basis (22).

Figure 5:
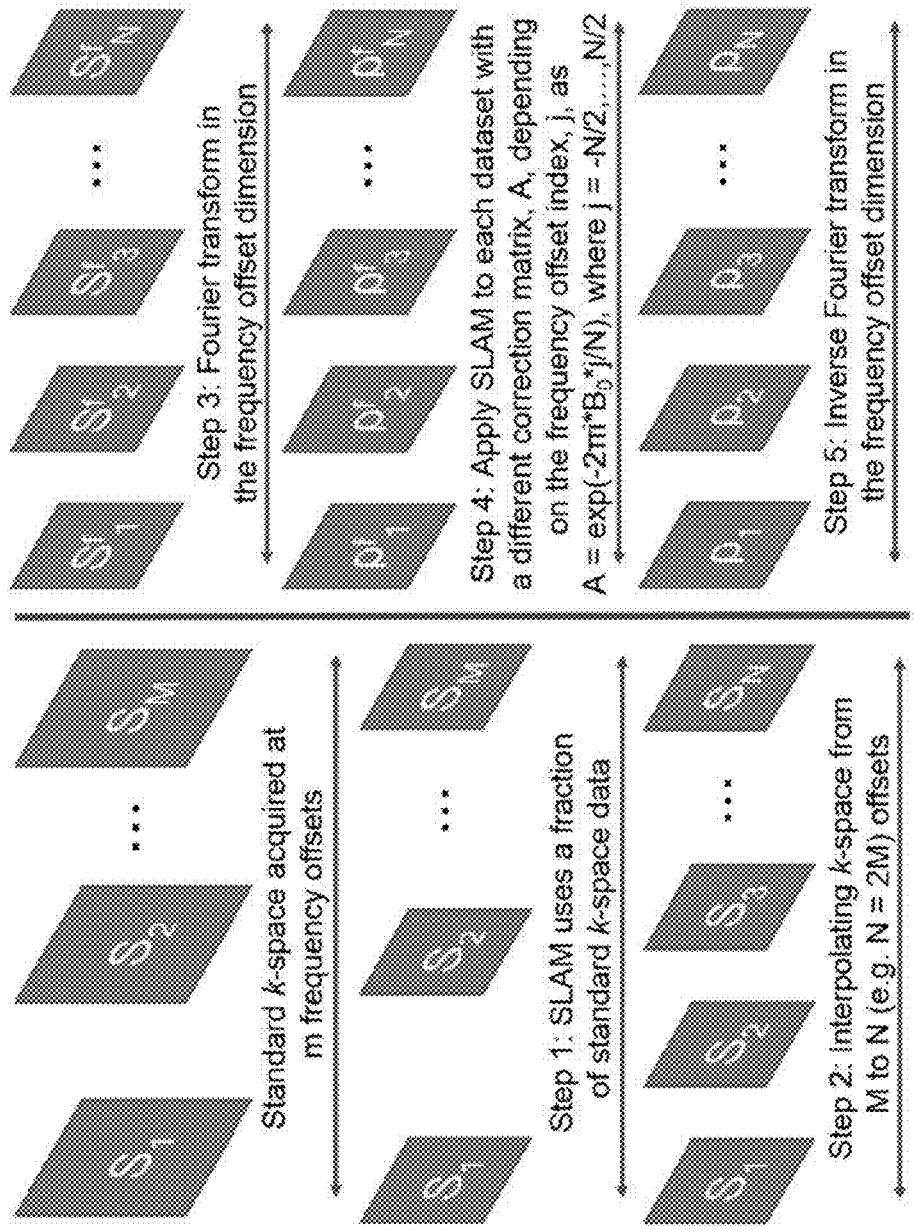
FIG. 5 shows schematic steps of incorporating linear interpolation and $B_0$ correction into SLAM. $s_1 \ldots s_M$ denote standard k-space raw data acquired at M saturation frequencies. $s_1^f \ldots s_N^f$ refer to interpolated SLAM hybrid k-space data after Fourier transformation (FT) in the saturation frequency dimension, corresponding to $s_{M*N}^f$ in Eq. [7]. $\rho_1^f \ldots \rho_N^f$ represent intermediate SLAM results after correction for nonuniformity in the main magnetic field, $B_0$, corresponding to $\rho_{C*N}^f$ in Eq. [7]. $\rho_{C*N}^r$ is the inverse FT of $\rho_{C*N}^f$ in the saturation frequency offset dimension and gives the SLAM compartmental z-spectra.
Figures 6A, 6B, 6C, 6D:
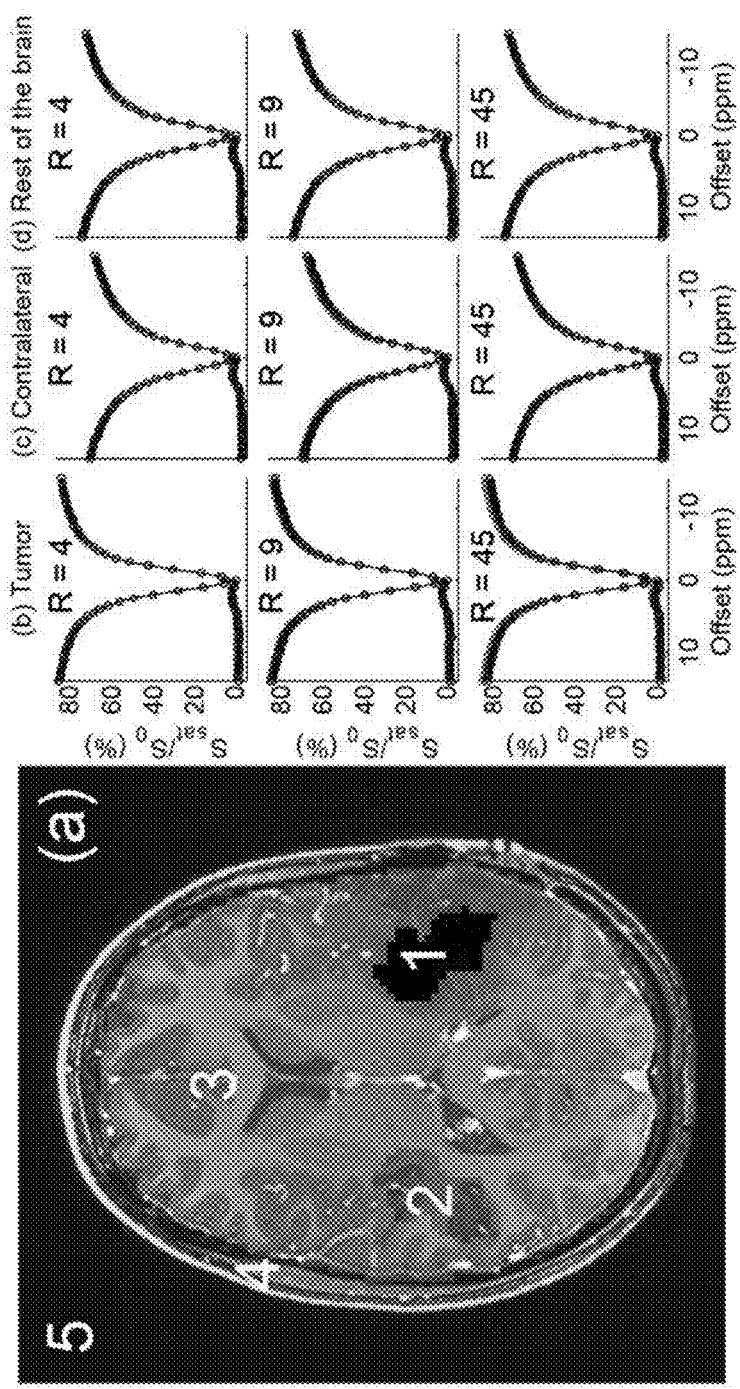
FIGS. 6A-6D show an anatomical image, and SLAM overlaid with conventional FT z-spectra for a patient with a low-grade oligodendroglioma. a: Segmentation of the gadolinium-enhanced $T_1$-weighted (T1w) image showing tumor (1), contralateral brain (2), "rest of the brain" (3), scalp (4) and background (5) compartments. b-d: SLAM z-spectra (black) in accordance with embodiments of the present invention, overlaid onto conventional FT (gray) z-spectra for acceleration factors R=4 (top), 9 (middle) and 45 (bottom) for the tumor (b), contralateral brain (c), and "rest of the brain" compartments (d). The horizontal axis indicates saturation frequency offsets and the vertical axis indicates the saturated CEST signal intensity normalized by the unsaturated signal intensity expressed as a percentage.
Figures 7A, 7B, 7C, 7D:
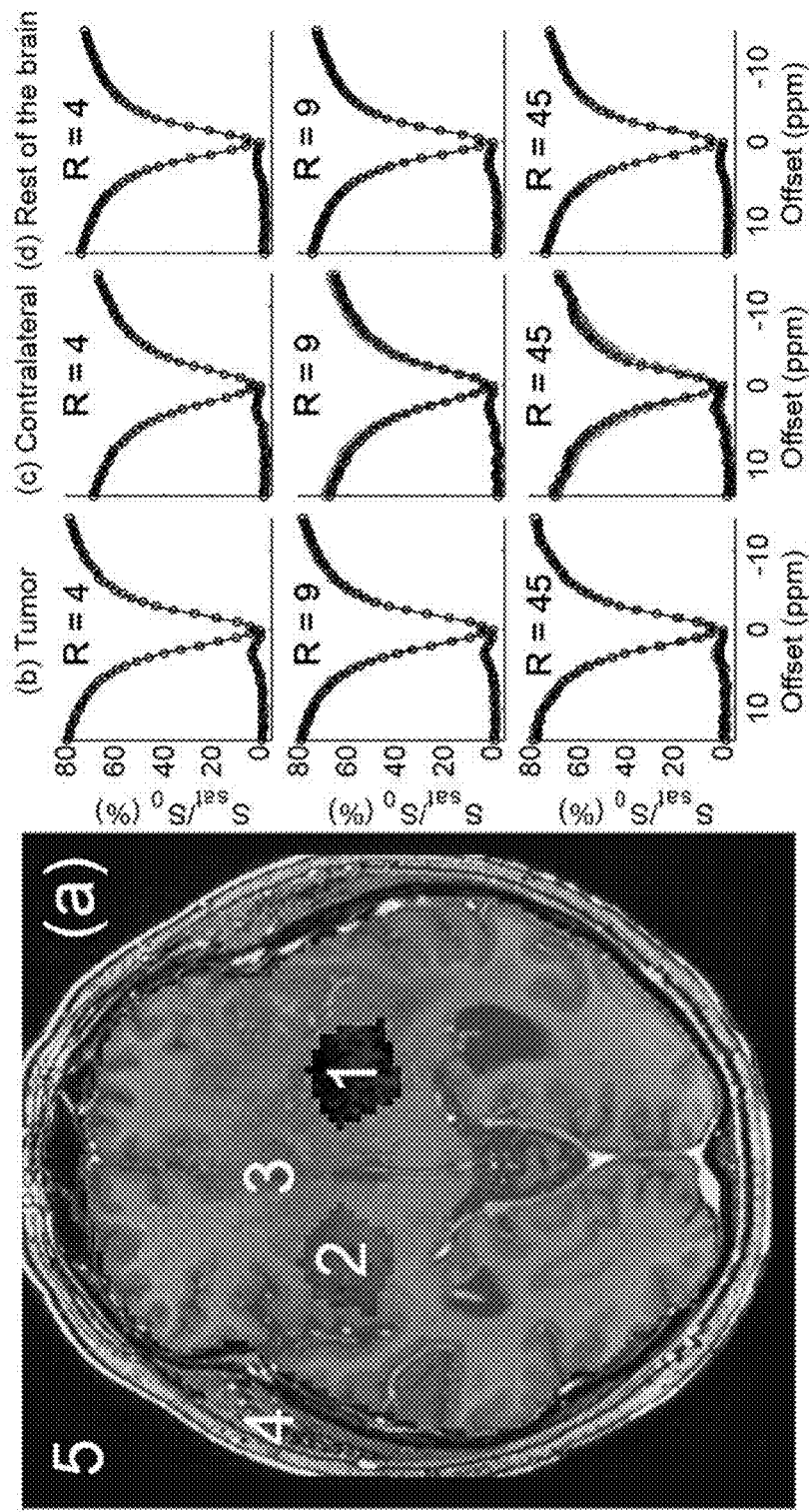
FIGS. 7A-7D show an anatomical image, and SLAM overlaid with conventional FT z-spectra for a patient with a high-grade anaplastic astrocytoma. a: Segmentation of the corresponding gadolinium-enhanced T1w anatomical image showing tumor (1), contralateral brain (2), "rest of the brain" (3), scalp (4) and background (5). b-d: SLAM z-spectra (black) acquired using an embodiment of the present invention, overlaid onto conventional FT (gray) z-spectra for acceleration factors, R, of 4 (top), 9 (middle) and 45 (bottom), for the tumor (b), the contralateral brain (c), and the "rest of the brain" compartments (d). The horizontal axis indicates saturation frequency offsets and the vertical axis indicates the saturated CEST signal intensity normalized by the unsaturated signal intensity expressed as a percentage.

In a ninth exemplary embodiment wherein SLAM is applied to CEST MRI to yield compartment average CEST measurements, this $B_0$ correction is accommodated in SLAM, which operates in k-space instead of image space, with the performance of two steps. First, a linear interpolation is applied along the saturation frequency offset dimension, to CEST k-space raw data that is acquired with the SLAM-reduced spatial phase encoding. This interpolation is equivalent to interpolation in image space, of the frequency offset domain. Second, a $B_0$ correction is implemented by incorporating a regular $B_0$ map that is ordinarily acquired for shimming purposes as part of an MRI exam, into the A term in Eq. [6], after stacking the $\rho_C^r$ solutions for all offset frequencies. The FT of the stack in the offset dimension is then performed, yielding $$\rho_{C*N}^f = (b_{M*C}^r)^+ \times A_{M*M} \times (E_{M*M})^+ \times s_{M*N}^f, \quad [7]$$

where $s_{M*N}^f$ is the FT of stacked $s_{M*N}$ in the frequency offset dimension; N is the number of interpolated frequency offsets; and $\rho_{C*N}^f$ is the FT of stacked $\rho_{C*N}^r$ in the offset dimension. In Eq. [7], $A = e^{-i2\pi * B_0 * j/N}$ is different for each frequency offset index, j, with $-N/2 \leq j \leq N/2$, and $B_0(x,y,z)$ is the standard $B_0$ spatial correction map. Finally, an inverse FT of $\rho_{C*N}^f$ leads to the compartmental-average z-spectrum in image space, $\rho_{C*N}^r$. Schematic steps for incorporating interpolation and shifting into SLAM are shown in FIG. 5.

Another important adaptation that is not yet included in Eq. [7] is the normalization of z-spectra, wherein the saturated image is divided by the unsaturated reference image. The unsaturated reference image is not subjected to any interpolation or shifting operations. To accommodate normalization, Eq. [7] can be modified to:

$$\rho_{C*N}^f = (b_{M*C}^r)^+ \times A_{M*M} \times \{[(E_{M*M})^+ \times s_{M*N}^f]./[(E_{M*M})^+ \times s_{M*N}^0]\}, \quad [8]$$

where ./ denotes element-wise division of two matrices and $s_{M*N}^0$ is the stacked k-space data from the unsaturated scan obtained by replicating acquired raw data, $s_{M'}^0$, N times in the frequency offset domain. All other processing steps are the same as shown in FIG. 5, with the data sets comprising a set of CEST-sensitive MRI data.

FIGS. 6A-6D compares SLAM z-spectra (black) with conventional FT z-spectra (gray) in a patient with a low-grade oligodendroglioma, at three acceleration factors (top to bottom: R=4, 9, and 45) corresponding to up to 45-fold reductions in scan-time. SLAM z-spectra from the tumor (FIG. 6B), contralateral (FIG. 6C) and "rest of the brain" (FIG. 6D) compartments are essentially coincident with the conventional FT spectra. Note that, with R=45, SLAM used only a single phase-encoding k-space line: the rest of the spatial information derives from the sensitivity encoding using the multi-element head detector coil. FIGS. 7A-7D compares SLAM and conventional FT z-spectra for another patient with a high-grade anaplastic astrocytoma. Again the z-spectra from the three compartments are highly coincident, especially with an R=4 (top) acceleration factor.

Figures 8A, 8B:
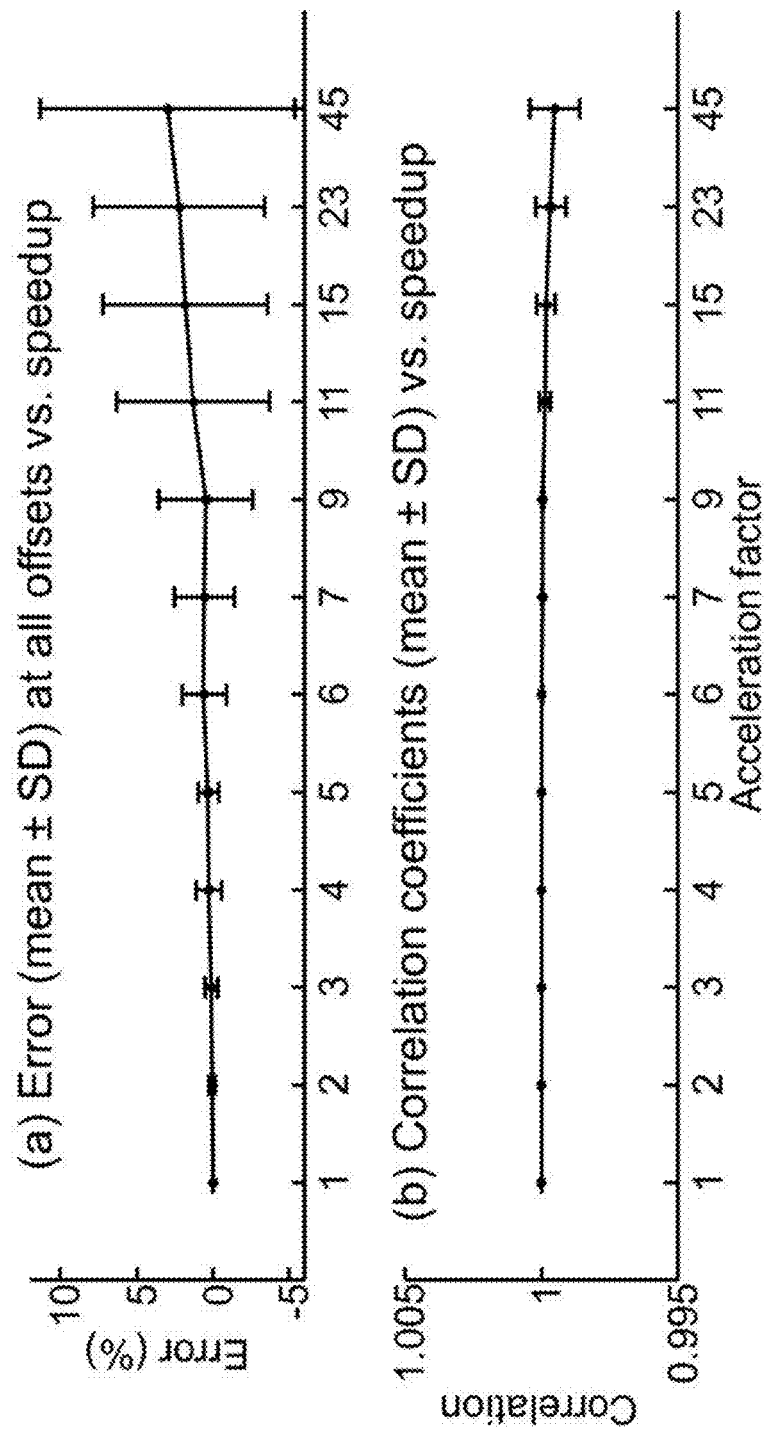
FIGS. 8A-8B show error analysis of SLAM CEST data acquired using an embodiment of the present invention, vs. conventional FT z-spectra at all frequency offsets. a: Mean±SD of error percentage (SLAM/FT−1) for all brain compartments from 8 subjects, with 12 different accelerations factors (R, horizontal axes). b: Pearson's correlation coefficients (mean±standard deviation) comparing SLAM with conventional FT spectra for all brain compartments, data sets and acceleration factors.

FIGS. 8A-8B plots the error and Pearson's correlation coefficients (r) for the entire z-spectra obtained from SLAM in 8 subjects, as compared to those from conventional FT. The percentage error (FIG. 8A) increases as the acceleration factor grows, with a mean value of ≤3.0% and SD of ≤8.3%, comparable to those measured at frequency offsets of ±3.5 ppm. The Pearson's correlation coefficients remain high for all R, dropping to 0.9995±0.0009% (mean±SD) at R=45, reflecting the high coincidence of the SLAM and conventional FT z-spectra overall (FIGS. 6A-7D).

SLAM is a new method to accelerate the acquisition of NMR and MRI measurements that are spatially localized to arbitrarily shaped compartments, many-fold. If compartment-average indices can suffice, SLAM can speed up clinical or animal studies by up to scores-fold and generate quantitatively equivalent results to compartment average measures obtain by conventional (FT) MRI methods, SLAM's ability to yield MRI measures within scan times of a minute or less should facilitate its application in many clinical settings where scan time is at a premium.

REFERENCES

1. Bottomley P A, Foster T H, Argersinger R E, Pfeifer L M. A review of normal tissue hydrogen NMR relaxation times and relaxation mechanisms from 1-100 MHz:

dependence on tissue type, NMR frequency, temperature, species, excision, and age. Med Phys 1984; 11:425.
2. Borthakur A, Mellon E, Niyogi S, Witschey W, Kneeland J B, Reddy R. Sodium and T1ρ MRI for molecular and diagnostic imaging of articular cartilage. NMR Biomed 2006; 19(7):781-821.
3. Chavhan G B, Babyn P S, Thomas B, Shroff M M, Haacke E M. Principles, Techniques, and Applications of T2*-based M R Imaging and Its Special Applications 1. Radiographics 2009; 29(5):1433-1449.
4. Basser P J, Mattiello J, LeBihan D. M R diffusion tensor spectroscopy and imaging. Biophys J 1994; 66(1):259.
5. Detre J A, Leigh J S, Williams D S, Koretsky A P. Perfusion imaging. Magn Reson Med 1992; 23(1):37-45.
6. Biswal B, Zerrin Yetkin F, Haughton V M, Hyde J S. Functional connectivity in the motor cortex of resting human brain using echo-planar mri. Magn Reson Med 1995; 34(4):537-541.
7. Posse S, Otazo R, Dager S R, Alger J. M R spectroscopic imaging: principles and recent advances. J Magn Reson Imaging 2013; 37(6):1301-1325.
8. Forsén S, Hoffman R A. Study of moderately rapid chemical exchange reactions by means of nuclear magnetic double resonance. The Journal of Chemical Physics 1963; 39(11):2892-2901.
9. Wolff S D, Balaban R S. Magnetization transfer contrast (MTC) and tissue water proton relaxation in vivo. Magn Reson Med 1989; 10(1):135-144.
10. Ward K, Aletras A, Balaban R. A new class of contrast agents for MRI based on proton chemical exchange dependent saturation transfer (CEST). J Magn Reson 2000; 143(1):79-87.
11. Zhang Y, Gabr R E, Schar M, Weiss R G, Bottomley P A. Magnetic resonance Spectroscopy with Linear Algebraic Modeling (SLAM) for higher speed and sensitivity. J Magn Reson 2012; 218:66-76.
12. Zhang Y, Gabr R E, Zhou J, Weiss R G, Bottomley P A. Highly-accelerated quantitative 2D and 3D localized spectroscopy with linear algebraic modeling (SLAM) and sensitivity encoding. J Magn Reson 2013; 237:125-138.
13. Pruessmann K P, Weiger M, Scheidegger M B, Boesiger P. SENSE: sensitivity encoding for fast MRI. Magn Reson Med 1999; 42(5):952-962.
14. Loan C F V. The ubiquitous Kronecker product. J Comput Appl Math 2000; 123(1):85-100.
15. Pruessmann K P, Weiger M, Börnert P, Boesiger P. Advances in sensitivity encoding with arbitrary k-space trajectories. Magn Reson Med 2001; 46(4):638-651.
16. Hoge W S, Brooks D H, Madore B, Kyriakos W E. A tour of accelerated parallel M R imaging from a linear systems perspective. Concepts Magn Reson Part A 2005; 27(1): 17-37.
17. Weiss R G, Gerstenblith G, Bottomley P A. ATP flux through creatine kinase in the normal, stressed, and failing human heart. Proc Natl Acad Sci USA 2005; 102(3):808-813.
18. Bottomley P A, Ouwerkerk R, Lee R F, Weiss R G. Four-angle saturation transfer (FAST) method for measuring creatine kinase reaction rates in vivo. Magn Reson Med 2002; 47(5):850-863.
19. Schär M, El-Sharkawy A M M, Weiss R G, Bottomley P A. Triple repetition time saturation transfer (TRiST) $^{31}$P spectroscopy for measuring human creatine kinase reaction kinetics. Magn Reson Med 2010; 63(6):1493-1501.
20. Zhou J, Blakeley J O, Hua J, Kim M, Laterra J, Pomper M G, van Zijl P. Practical data acquisition method for human brain tumor amide proton transfer (APT) imaging. Magn Reson Med 2008; 60(4):842-849.
21. Kim M, Gillen J, Landman B A, Zhou J, van Zijl P. Water saturation shift referencing (WASSR) for chemical exchange saturation transfer (CEST) experiments. Magn Reson Med 2009; 61(6):1441-1450.
22. Zhou J, Zhu H, Lim M, Blair L, Quinones-Hinojosa A, Messina S A, Eberhart C G, Pomper M G, Laterra J, Barker P B. Three-dimensional amide proton transfer M R imaging of gliomas: Initial experience and comparison with gadolinium enhancement. J Magn Reson Imaging 2013; 38(5):1119-1128.

The embodiments illustrated and discussed in this specification are intended only to teach those skilled in the art how to make and use the invention. In describing embodiments of the invention, specific terminology is employed for the sake of clarity. However, the invention is not intended to be limited to the specific terminology so selected. The above-described embodiments of the invention may be modified or varied, without departing from the invention, as appreciated by those skilled in the art in light of the above teachings. It is therefore to be understood that, within the scope of the claims and their equivalents, the invention may be practiced otherwise than as specifically described.

We claim:

1. A method of localizing a nuclear magnetic resonance (NMR) parameter to at least one compartment of interest of a sample undergoing an NMR examination, comprising:
   placing said sample in an NMR system;
   performing a first magnetic resonance imaging (MRI) of at least a portion of said sample with a first MRI pulse sequence using said NMR system and using at least one of a set of k-space spatial encoding gradients or coil sensitivity encoding maps to obtain a first magnetic resonance image to identify at least one compartment of interest;
   generating a second MRI pulse sequence that encodes said NMR parameter with a subset of said at least one of said set of k-space spatial encoding gradients or said coil sensitivity encoding maps;
   applying said second MRI pulse sequence using said NMR system to acquire spatial information relating to said NMR parameter from said at least one compartment of interest;
   segmenting said first magnetic resonance image into a plurality of compartments that includes said at least one compartment of interest; and
   reconstructing a value of said NMR parameter in said at least one compartment of interest,
   wherein said NMR parameter is one of a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index.

2. The method of claim 1, wherein said at least one of said set of k-space spatial encoding gradients or coil sensitivity encoding maps is said coil sensitivity encoding maps.

3. The method of claim 1, wherein said subset of said set of k-space spatial encoding gradients are chosen from a center of k-space.

4. The method of claim 1, wherein said value of said NMR parameter obtained from said at least one compartment of interest, substantially represents an average value of said NMR parameter in said at least one compartment of interest.

5. The method of claim 1, wherein said at least one compartment of interest has an irregular shape.

6. The method of claim 1, further comprising applying said second MRI pulse sequence a plurality of times,
wherein each of said plurality of applications of said second MRI pulse sequence is encoded to cause a corresponding MRI signal to be sensitive to a plurality of parameters selected from a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index, said corresponding MRI signal thereby being a parameter-sensitive MRI signal.

7. The method of claim 6, further comprising reconstructing for each of said plurality of applications of said second MRI pulse sequence a corresponding compartment average measure of said parameter-sensitive MRI signal,
wherein each said compartment average measure of the said parameter-sensitive MRI signal is used to determine a compartment average measure of one of a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index.

8. The method of claim 6, wherein an agent by which said MRI signal from said second MRI pulse sequence is rendered sensitive to a relaxation time is one of a pulse sequence timing parameter.

9. The method of claim 8, wherein said pulse sequence timing parameter is one of a pulse sequence repetition period, an inversion time, or an echo time.

10. The method of claim 6, wherein an agent by which said MRI signal from said second MRI pulse sequence is rendered sensitive to a diffusion coefficient is a pulsed magnetic field gradient or oscillating magnetic field gradient.

11. The method of claim 6, wherein an agent by which said MRI signal from said second MRI pulse sequence is rendered sensitive to perfusion is a slice selective MRI pulse applied to one of inflowing or outflowing blood.

12. The method of claim 6, wherein an agent by which said MRI signal from said second MRI pulse sequence is rendered sensitive to a chemical reaction rate is a chemical selective irradiation pulse applied to a chemical specie participating in a corresponding chemical reaction.

13. The method of claim 6, wherein an agent by which said MRI signal from said second MRI pulse sequence is rendered sensitive to a CEST index is a frequency selective saturation NMR pulse with an offset frequency.

14. The method of claim 13, wherein said MRI signal is corrected for inhomogeneity in a main magnetic field ($B_0$) by a correction process, said correction process comprising:
stacking CEST parameter sensitive MRI data for each offset frequency such that corresponding data sets are aligned in a saturation frequency dimension;
linearly interpolating image k-space data in a saturation frequency domain;
incorporating a regular $B_0$ map into a correction matrix that accounts for spatial and temporal variations in applied magnetic fields; and
reconstructing a compartment-average CEST sensitive parameter for each $B_0$-corrected offset frequency.

15. The method of claim 13, wherein an additional MRI data set is acquired in which no frequency-selective saturation is applied, and
wherein a CEST sensitive MRI signal at each offset frequency is normalized by dividing by a signal acquired without frequency-selective saturation for said at least one compartment.

16. An NMR system for acquiring and reconstructing a value of an NMR parameter spatially localized to at least one compartment of interest, said NMR system employing an applied static magnetic field $B_0$, and NMR excitation and detection systems, and comprising an MRI apparatus configured to accommodate a sample of interest,
wherein said MRI apparatus is configured to:
perform a first magnetic resonance imaging (MRI) of at least a portion of said sample with a first MRI pulse sequence using said NMR system and using at least one of a set of k-space spatial encoding gradients or coil sensitivity encoding maps to obtain a first magnetic resonance image to identify at least one compartment of interest;
generate a second MRI pulse sequence that encodes said NMR parameter with a subset of said at least one of said set of k-space spatial encoding gradients or said coil sensitivity encoding maps;
apply said second MRI pulse sequence using said NMR system to acquire spatial information relating to said NMR parameter from said at least one compartment of interest;
segment said first magnetic resonance image into a plurality of compartments that includes said at least one compartment of interest; and
reconstruct a value of said NMR parameter in said at least one compartment of interest,
wherein said NMR parameter is one of a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index.

17. The NMR system of claim 16, wherein said at least one of said set of k-space spatial encoding gradients or coil sensitivity encoding maps is said coil sensitivity encoding maps.

18. The NMR system of claim 16, wherein said subset of said set of k-space spatial encoding gradients are chosen from a center of k-space.

19. The NMR system of claim 16, wherein said value of said NMR parameter obtained from said at least one compartment of interest, substantially represents an average value of said NMR parameter in said at least one compartment of interest.

20. The NMR system of claim 16, wherein said at least one compartment of interest has an irregular shape.

21. The NMR system of claim 16, further comprising applying said second MRI pulse sequence a plurality of times,
wherein each of said plurality of applications of said second MRI pulse sequence is encoded to cause a corresponding MRI signal to be sensitive to a plurality of parameters selected from a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index, said corresponding MRI signal thereby being a parameter-sensitive MRI signal.

22. The NMR system of claim 21, further comprising reconstructing for each of said plurality of applications of said second MRI pulse sequence a corresponding compartment average measure of said parameter-sensitive MRI signal, wherein each said compartment average measure of the said parameter-sensitive MRI signal is used to determine a compartment average measure of one of a nuclear spin density, a relaxation time $T_1$, $T_{1\rho}$, $T_2$, or $T_{2*}$, a diffusion coefficient, a perfusion measure, a functional measure, a spectral parameter, a chemical reaction rate, or a chemical exchange saturation transfer (CEST) index.

23. The NMR system of claim 22, wherein an agent by which said MRI signal from said second MRI pulse sequence is rendered sensitive to a relaxation time is one of a pulse sequence timing parameter.

24. The NMR system of claim 23, wherein said pulse sequence timing parameter is one of a pulse sequence repetition period, an inversion time, or an echo time.

25. The NMR system of claim 22, wherein an agent by which said MRI signal from said second MRI pulse sequence is rendered sensitive to a diffusion coefficient is a pulsed magnetic field gradient or oscillating magnetic field gradient.

26. The NMR system of claim 22, wherein an agent by which said MRI signal from said second MRI pulse sequence is rendered sensitive to perfusion is a slice selective MRI pulse applied to one of inflowing or outflowing blood.

27. The NMR system of claim 22, wherein an agent by which said MRI signal from said second MRI pulse sequence is rendered sensitive to a chemical reaction rate is a chemical selective irradiation pulse applied to a chemical specie participating in a corresponding chemical reaction.

28. The NMR system of claim 22, wherein an agent by which said MRI signal from said second MRI pulse sequence is rendered sensitive to a CEST index is a frequency selective saturation NMR pulse with an offset frequency.

29. The NMR system of claim 28, wherein said MRI signal is corrected for inhomogeneity in a main magnetic field ($B_0$) by a correction process, said correction process comprising:
 stacking CEST parameter sensitive MRI data for each offset frequency such that corresponding data sets are aligned in a saturation frequency dimension;
 linearly interpolating image k-space data in a saturation frequency domain;
 incorporating a regular $B_0$ map into a correction matrix that accounts for spatial and temporal variations in the applied magnetic fields; and
 reconstructing a compartment-average CEST sensitive parameter for each $B_0$-corrected offset frequency.

30. The NMR system of claim 28, wherein an additional MRI data set is acquired in which no frequency-selective saturation is applied, and
 wherein a CEST sensitive MRI signal at each offset frequency is normalized by dividing by a signal acquired without frequency-selective saturation for said at least one compartment.

* * * * *